United States Patent
Lim et al.

(10) Patent No.: US 7,871,915 B2
(45) Date of Patent: Jan. 18, 2011

(54) METHOD FOR FORMING METAL GATES IN A GATE LAST PROCESS

(75) Inventors: Peng-Soon Lim, Johor (TW); Yong-Tian Hou, Singapore (SG); Chien-Hao Chen, Chuangwei Township, Ilan County (TW); Chi-Chun Chen, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 14 days.

(21) Appl. No.: 12/411,546

(22) Filed: Mar. 26, 2009

(65) Prior Publication Data

US 2010/0081262 A1 Apr. 1, 2010

Related U.S. Application Data

(60) Provisional application No. 61/100,571, filed on Sep. 26, 2008.

(51) Int. Cl.
*H01L 21/3205* (2006.01)
*H01L 21/4763* (2006.01)
*H01L 29/78* (2006.01)

(52) U.S. Cl. ............... 438/592; 438/183; 438/199; 438/216; 438/275; 257/369; 257/407; 257/410; 257/412; 257/E29.134; 257/E21.444; 257/388

(58) Field of Classification Search ........... 438/183, 438/275, 592; 257/407, E21.444, 410, 412, 257/388, E29.134
See application file for complete search history.

(56) References Cited

U.S. PATENT DOCUMENTS

| | | | |
|---|---|---|---|
| 6,506,676 B2 | 1/2003 | Park et al. | |
| 6,673,718 B1* | 1/2004 | Lee et al. | 438/677 |
| 6,864,163 B1 | 3/2005 | Yu et al. | |
| 6,872,627 B2 | 3/2005 | Chen et al. | |
| 7,005,365 B2 | 2/2006 | Chambers | |
| 7,148,548 B2 | 12/2006 | Doczy et al. | |
| 2006/0094180 A1* | 5/2006 | Doczy et al. | 438/199 |
| 2007/0066077 A1* | 3/2007 | Akasaka et al. | 438/710 |
| 2009/0179285 A1* | 7/2009 | Wood et al. | 257/412 |

* cited by examiner

*Primary Examiner*—Ha Tran T Nguyen
*Assistant Examiner*—Aaron A Dehne
(74) *Attorney, Agent, or Firm*—Haynes and Boone, LLP

(57) ABSTRACT

The present disclosure provides a method of fabricating a semiconductor device that includes providing a substrate having a first region and a second region, forming first and second gate stacks in the first and second regions, respectively, the first gate stack including a first dummy gate and the second gate stack including a second dummy gate, removing the first dummy gate in the first gate stack thereby forming a first trench and removing the second dummy gate in the second gate stack thereby forming a second trench, forming a first metal layer in the first trench and in the second trench, removing at least a portion of the first metal layer in the first trench, forming a second metal layer in the remainder of the first trench and in the remainder of the second trench, reflowing the second metal layer, and performing a chemical mechanical polishing (CMP).

15 Claims, 10 Drawing Sheets

METHOD FOR FORMING METAL GATES IN A GATE LAST PROCESS

PRIORITY DATA

This application claims priority to Provisional Application Ser. No. 61/100,571, filed on Sep. 26, 2008, entitled "METHOD FOR FORMING METAL GATES IN A GATE LAST PROCESS," the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. However, an n-type MOS device (NMOS) and a p-type MOS device (PMOS) require different work functions for their respective gate structures. One approach uses separate metal layers to properly achieve different work functions for the metal gates of the PMOS and NMOS devices. Although this approach has been satisfactory for its intended purpose, it has not been satisfactory in all respects.

SUMMARY

One of the broader forms of an embodiment of the present invention involves a method for fabricating a semiconductor device. The method includes providing a semiconductor substrate having a first region and a second region, forming a high-k dielectric layer over the semiconductor substrate, forming a semiconductor layer over the high-k dielectric layer, forming a first gate stack in the first region and a second gate stack in the second region, the first and second gate stacks each including the high-k dielectric layer and the semiconductor layer, removing the semiconductor layer from the first gate stack to form a first trench and from the second gate stack to form a second trench, forming a barrier layer in the first trench and the second trench, forming a first metal layer over the barrier layer, removing at least a portion of the first metal layer in the first trench, forming a second metal layer in the first trench and in the second trench, and performing a thermal process to reflow the second metal layer.

Another one of the broader forms of an embodiment of the present invention involves a method for fabricating a semiconductor device. The method includes providing a semiconductor substrate having a first region and a second region, forming a first gate stack in the first region and a second gate stack in the second region, the first gate stack including a first dummy gate and the second gate stack including a second dummy gate, removing the first dummy gate in the first gate stack thereby forming a first trench and removing the second dummy gate in the second gate stack thereby forming a second trench, forming a first metal layer in the first trench and in the second trench, removing at least a portion of the first metal layer in the first trench, forming a second metal layer in the remainder of the first trench and in the remainder of the second trench, reflowing the second metal layer, and performing a chemical mechanical polishing (CMP).

Yet another one of the broader forms of an embodiment of the present invention involves a method for fabricating a semiconductor device. The method includes providing a semiconductor substrate having a first region and a second region; forming a first gate stack in the first region and a second gate stack in the second region, the first gate stack including a first dummy gate and the second gate stack including a second dummy gate; removing the first dummy gate in the first gate stack thereby forming a first trench and removing the second dummy gate in the second gate stack thereby forming a second trench; forming a P-type work function metal (P-metal) layer to partially fill the first trench and the second trench; removing at least 50% of a thickness of the P-metal layer in the first trench; forming a Ti layer to partially fill the first trench and the second trench; forming an Al layer to fill the remainder of the first trench and the remainder of the second trench; reflowing the Al layer with the Ti layer; and performing a chemical mechanical polishing (CMP).

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, the present disclosure provides examples of a "gate last" metal gate process, however one skilled in the art may recognize applicability to other processes and/or use of other materials.

Figure 1:
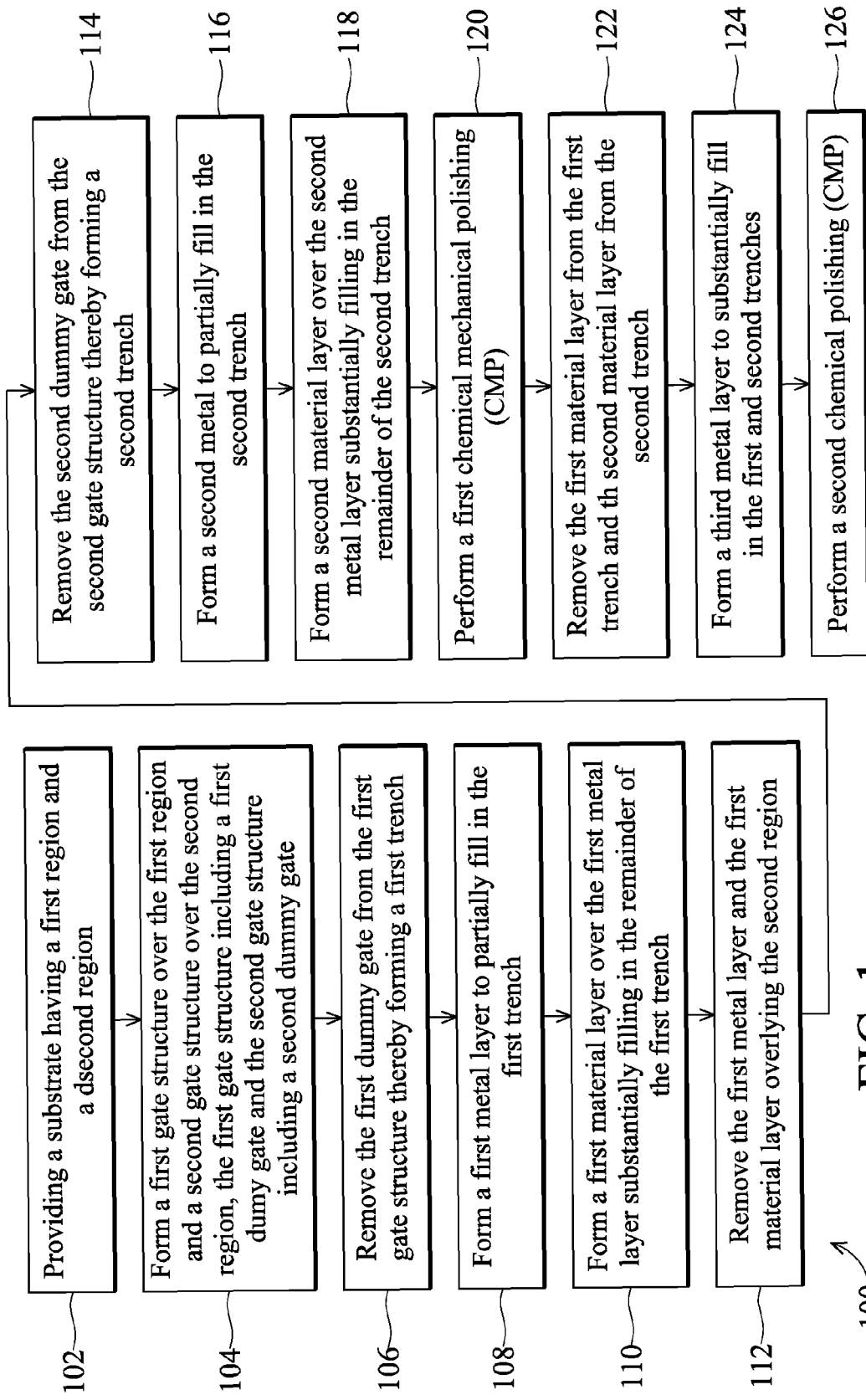
FIG. 1 is a flowchart illustrating a method for fabricating a semiconductor device having metal gates according to various aspects of the present disclosure.
Figure 2A:
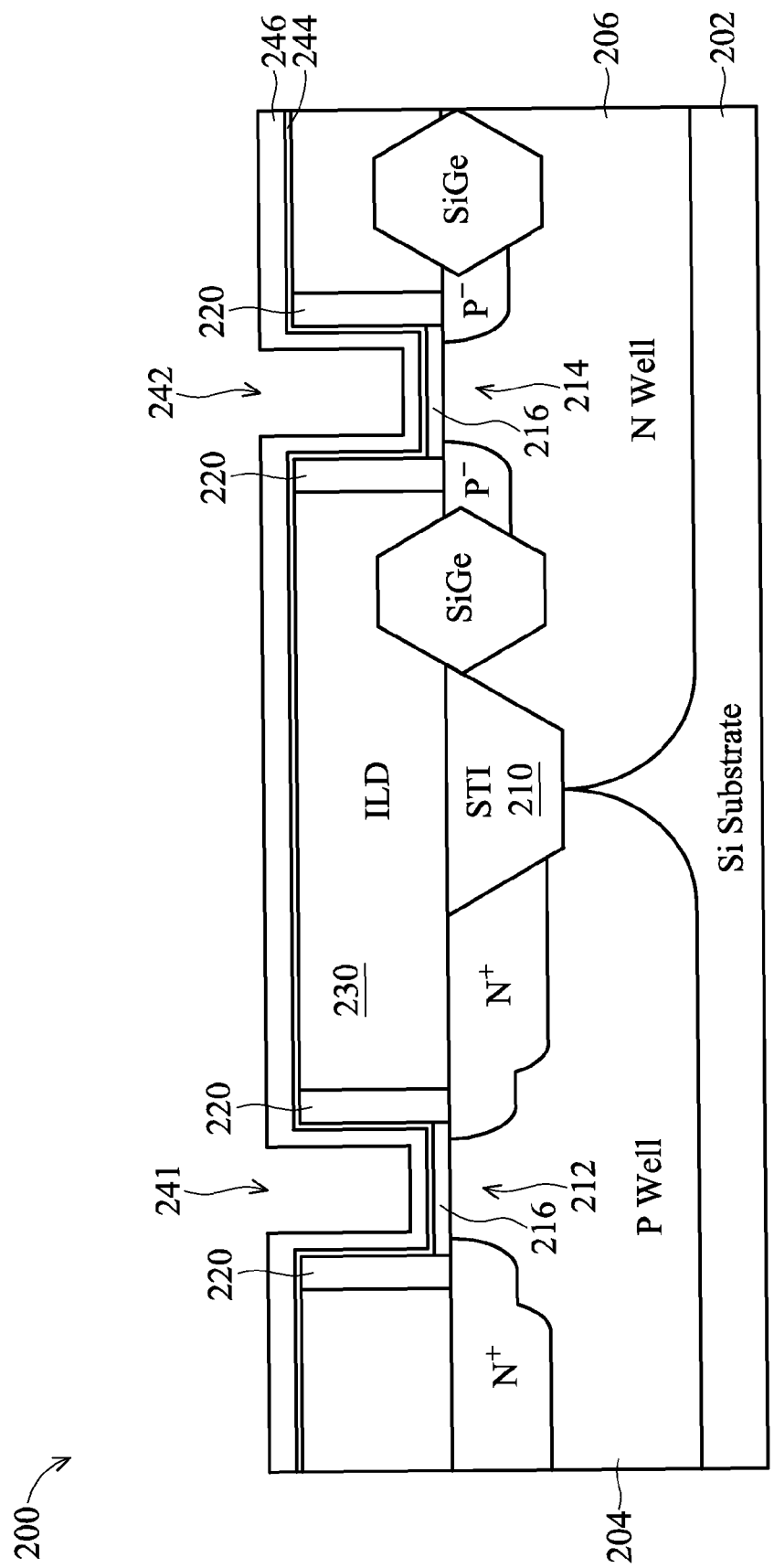
FIGS. 2A to 2E are cross-sectional views of a semiconductor device at various stages of fabrication according to the method of FIG. 1.

Referring to FIG. 1, illustrated is a flowchart of a method 100 for fabricating a semiconductor device having metal gates according to various aspects of the present disclosure. Referring also to FIGS. 2A to 2E, illustrated are cross-sectional views of a semiconductor device 200 at various stages of fabrication according to the method 100 of FIG. 1. It should be noted that part of the semiconductor device 200 may be fabricated with a CMOS process flow. Accordingly, it is understood that additional processes may be provided before, during, and after the method 100 of FIG. 1, and that some other processes may only be briefly described herein. The semiconductor device 200 may be fabricated in a gate last process (also referred to as a replacement poly gate process). In a gate last process, a dummy poly gate structure may be initially formed and may be followed a normal CMOS process flow until deposition of an interlayer dielectric (ILD). The dummy poly gate structure may then be removed and replaced with a metal gate structure. In FIG. 2A, the semiconductor 200 is shown following removal of the dummy poly gate structures (thereby forming trenches) and deposition of a P-type work function metal (P-metal) in the trenches as will be explained below.

The method 100 begins with block 102 in which a semiconductor substrate may be provided, the substrate having a first region and a second region. The semiconductor devthe semiconductor device 200 may include a semiconductor substrate 202 such as a silicon substrate. The substrate 202 may alternatively include silicon germanium, gallium arsenic, or other suitable semiconductor materials. The substrate 202 may further include doped regions such as a P-well 204 and N-well 206. The substrate may further include other features such as a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 200 may further include an isolation structure 210 such as a shallow trench isolation (STI) feature formed in the substrate 202 for isolating active regions 212 and 214 in the substrate. The isolation structure 210 may be formed of silicon oxide, silicon nitride, silicon oxynitride, fluoride-doped silicate (FSG), and/or a low k dielectric material known in the art. The active region 212 may be configured as an NMOS device (e.g., nFET) and the active region 214 may be configured as a PMOS device (e.g., pFET).

The method 100 continues with block 104 in which a first gate stack may be formed in the first region and a second gate stack may be formed in the second region, the first gate stack including a first dummy gate and the second gate stack including a second dummy gate. The formation of the gate stack includes forming various material layers, and etching/patterning the various material layers to form a gate stack of the nFET 212 and a gate stack of the pFET 214.

The semiconductor device 200 may include an interfacial layer formed over the substrate 202. The interfacial layer may include a silicon oxide layer (e.g., thermal or chemical oxide formation) having a thickness ranging from about 5 to about 10 angstrom (A). The semiconductor device 200 may further include a high-k dielectric layer 216 formed on the interfacial layer. The high-k dielectric layer 216 may be formed by atomic layer deposition (ALD) or other suitable technique. The high-k dielectric layer 216 may include a thickness ranging from about 10 to about 30 angstrom (A). The high-k dielectric layer 216 may include hafnium oxide (HfOx). Alternatively, the high-k dielectric layer 216 may optionally include other high-k dielectrics such as hafnium silicon oxide (HfSiO), hafnium silicon oxynitride (HfSiON), hafnium tantalum oxide (HffaO), hafnium titanium oxide (HffiO), hafnium zirconium oxide (HfZrO), and combinations thereof. Further, the high dielectric layer 216 may also include Sr-based or other high-k materials with k-values higher than hafnium oxide.

The semiconductor device 200 may further include a barrier layer formed over the high-k dielectric layer 216. The barrier layer may include TiN or TaN having a thickness ranging from about 10 to about 20 angstrom (A). The barrier layer may function as a barrier between the high-k dielectric layer 212 and a subsequent dummy poly gate structure to reduce or eliminate the risk of Fermi level pinning between the poly and the high-k dielectric 216 during subsequent processing. The barrier layer may be formed by various deposition techniques such as ALD, physical vapor deposition (PVD or sputtering), CVD, or other suitable technique. Alternatively, it should be noted that the barrier may be formed in a gate last flow when forming the metal gates as discussed below.

The semiconductor device 200 may further include a polysilicon (or poly) layer (not shown) formed over the barrier layer by a suitable deposition process. The poly layer may include a thickness ranging from about 400 to about 800 angstrom (A). The semiconductor device 200 may further include a hard mask layer (not shown) formed on the poly layer 218. The hard mask layer may include silicon nitride, silicon oxynitride, silicon carbide, and/or other suitable dielectric materials, and may be formed using a method such as CVD or PVD. The hard mask layer may include a thickness ranging from about 100 to about 400 angstrom (A). Additionally, the semiconductor device 200 may include an antireflective coating layer or bottom antireflective coating (BARC) layer to enhance a photolithography process for patterning a photoresist layer. For example, a patterned photoresist layer (not shown) may be formed on the hard mask layer including a pattern overlying the nFET 212 and a pattern overlying the pFET 214. The patterns may be used to pattern the hard mask layer by a dry etch or wet etch process.

The patterned hard mask may be used to form the gate stack in the nFET 212 and a gate stack in the pFET 214 by a dry etch, wet etch, or combination dry and wet etch process. Accordingly, The gate stacks may each include an interfacial layer, high-k dielectric 216, a barrier layer (optional), a dummy poly gate, and a hard mask.

After formation of the gate stacks (e.g., gate etching or patterning), it is understood that the semiconductor device 200 may undergo additional CMOS processing to form various features of the nFET 212 and pFET 214 as is known in the art. As such, the various features are only briefly discussed herein. The various features may include lightly doped source/drain regions (n-type and p-type LDD), sidewall or gate spacers 220, source/drain (S/D) regions (including raised S/D regions with SiGe features in pFET 214), silicide features, contact etch stop layer (CESL), and an interlayer dielectric (ILD) 230. The ILD 230 may include a oxide formed by a high aspect ratio process (HARP) and/or high density plasma (HDP) deposition process. The deposition of the ILD 230 fills in the gaps between the adjacent gate stacks of the nFET 212 and pFET 214. Thereafter, a chemical mechanical polishing (CMP) process or may be performed on the ILD 230 to planarize and polish the ILD until the dummy poly gates are exposed in the nFET 212 and pFET 214.

The method 100 continues with block 106 in which the first dummy gate may be removed from the first gate stack thereby forming a first trench and the second dummy gate may be removed from the second gate stack thereby form a second trench.

The dummy poly gate in the nFET 212 and dummy poly gate in the pFET 214 may be removed by an etch back process, dry etch, wet etch, or other suitable process. For example, a wet etch process may include exposure to a hydroxide containing solution (e.g., ammonium hydroxide), deionized water, and/or other suitable etchant solutions. The barrier layer (if formed in the gate first flow) may function as an etch barrier for the etching. The dummy poly gates may be selectively etched thereby forming a trench 241 in the nFET 212 side and a trench 242 in the pFET 214 side.

The method 100 continues with block 108 in which a barrier layer may be formed in the first trench and in the second trench. The barrier layer 244 may be formed on the high-k dielectric layer 216 in the trench 241 and in the trench 242. The barrier layer 244 may include TaN or TiN having a thickness ranging from about 10 to about 20 angstrom (A). The barrier layer 244 may be formed by various deposition techniques such as ALD, PVD, CVD, or other suitable technique. The barrier layer 244 may function as a diffusion barrier to protect the high-k dielectric layer 216.

The method 100 continues with block 110 in which a first metal layer may be formed over the barrier layer in the first trench and in the second trench. A work function metal may be formed over the barrier layer 244. In the present example, a P work function metal (P-metal) 246 may be formed over the barrier layer 244 and may fill in a portion of the trench 241 and in a portion of the trench 242. The P-metal 246 may include a layer of TiN and may have a thickness ranging from about 50 to about 100 angstrom (A). The P-metal layer may be formed by ALD, PVD, or other suitable process. Alternatively, the P-metal layer 246 may include a single metal layer or multi-metal layer structure with high effective work function (EWF) values such as TiN, Ru, Mo, Al, WN, their oxide or silicide derivatives, and combinations thereof.

Figure 2B:
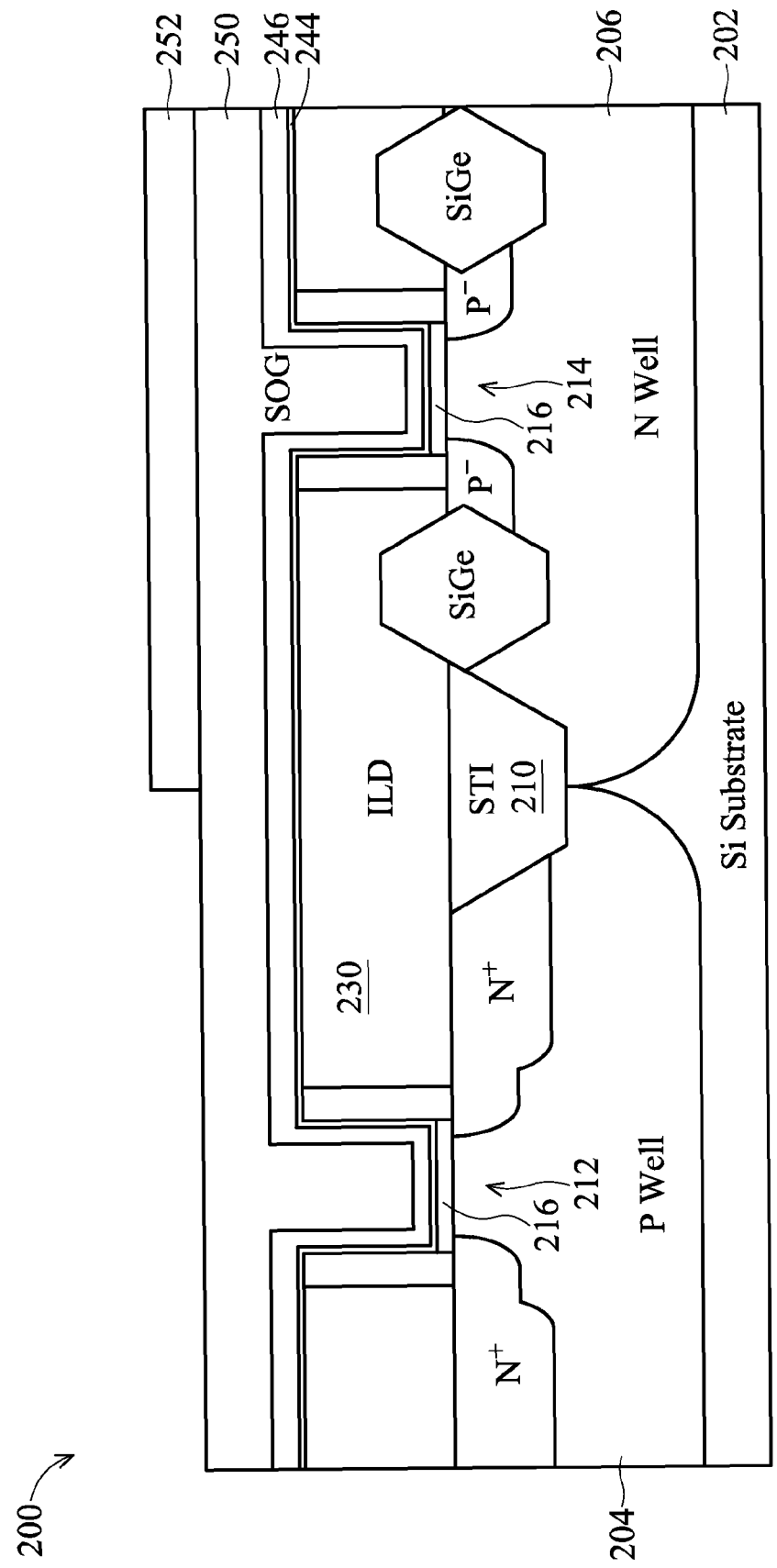
Figure 2C:
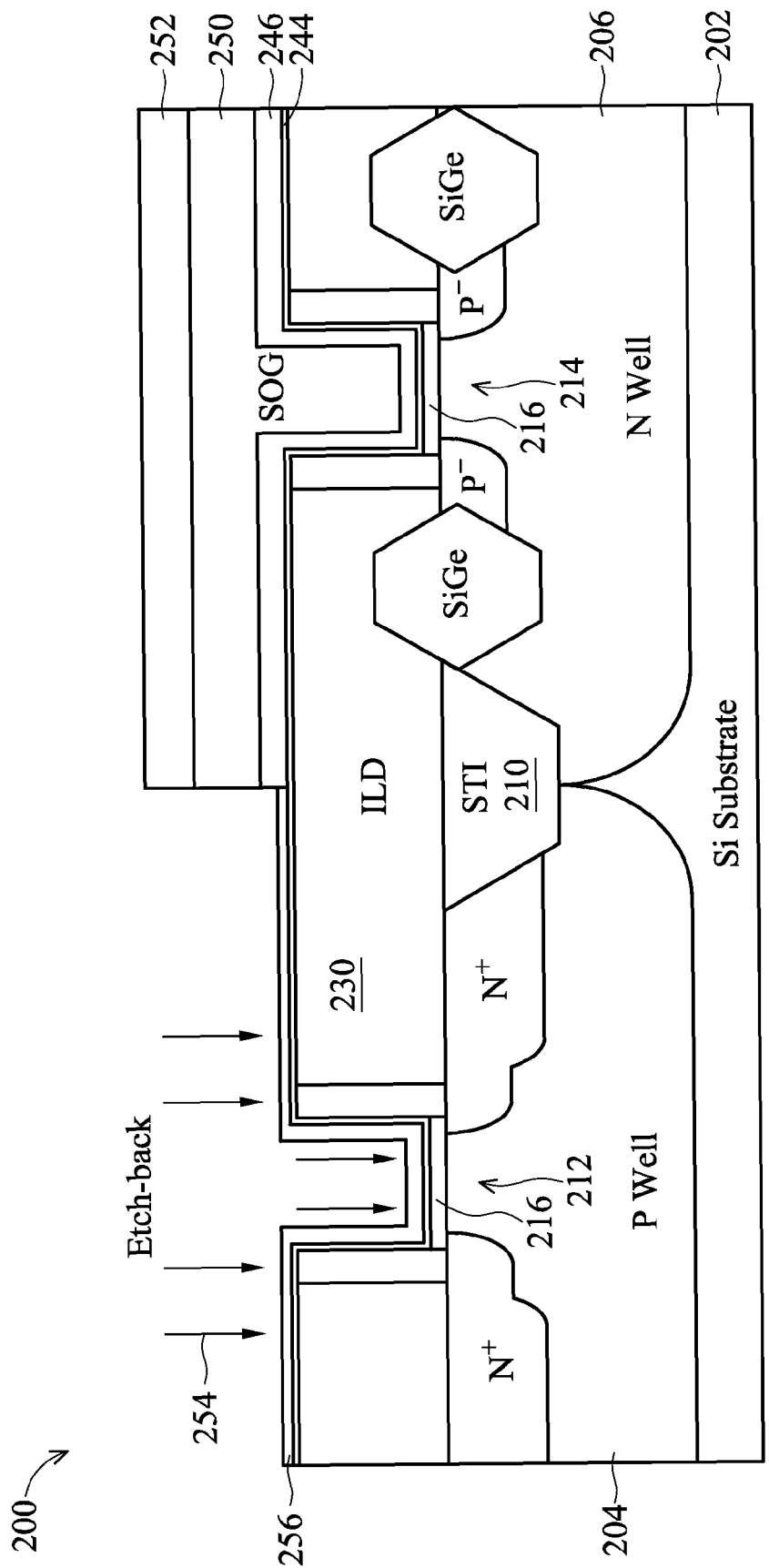

The method 100 continues with block 112 in which at least a portion of the first metal layer may be removed in the first trench. A portion of the P-metal layer 246 in the trench 241 of the nFET 212 side may be removed. In some embodiments, at least 50% (e.g., 50% or more) of the thickness of the P-metal layer 246 in the n-FET 212 side may be trimmed or thinned down. In other embodiments, the P-metal layer 246 in the n-FET side is trimmed to a final thickness that is less than 50 angstrom (A). In FIG. 2B, a protection layer 250 of oxide may be formed by a spin-on-glass (SOG) process to fill in the trenches 241 and 242. The patterned photoresist layer 252 may be formed to protect the pFET 214 side by a photolithography patterning process. For example, the photolithography process may include spin coating, soft-baking, exposure, post-baking, developing, rinsing, drying, and other suitable process. Alternatively, the N/P patterning may optionally include immersion lithography, electron beam lithography, or other suitable process. In FIG. 2C, the SOG layer 250 may be removed by a wet etching process, and the portion of the P-metal layer 246 in the trench 241 of the nFET 212 side may be remove by an etch back process 250. The etch back process 250 may employ either dry or wet etching. Accordingly, a thinner P-metal layer 256 is formed in the nFET 212 side. The SOG layer 250 and photoresist layer 252 in the pFET 214 side may be removed after the etch back process.

Figure 2D:
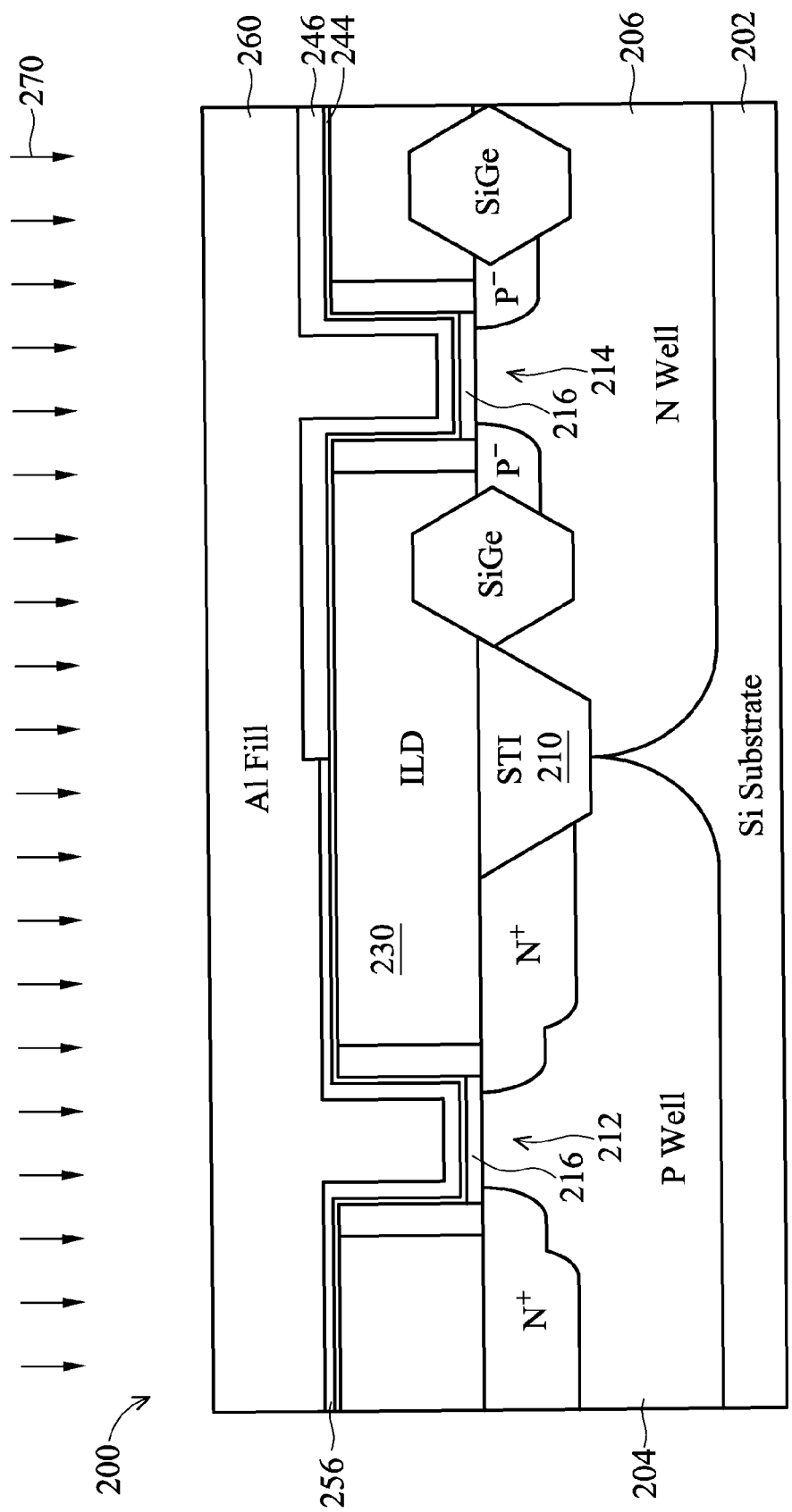
Figure 2E:
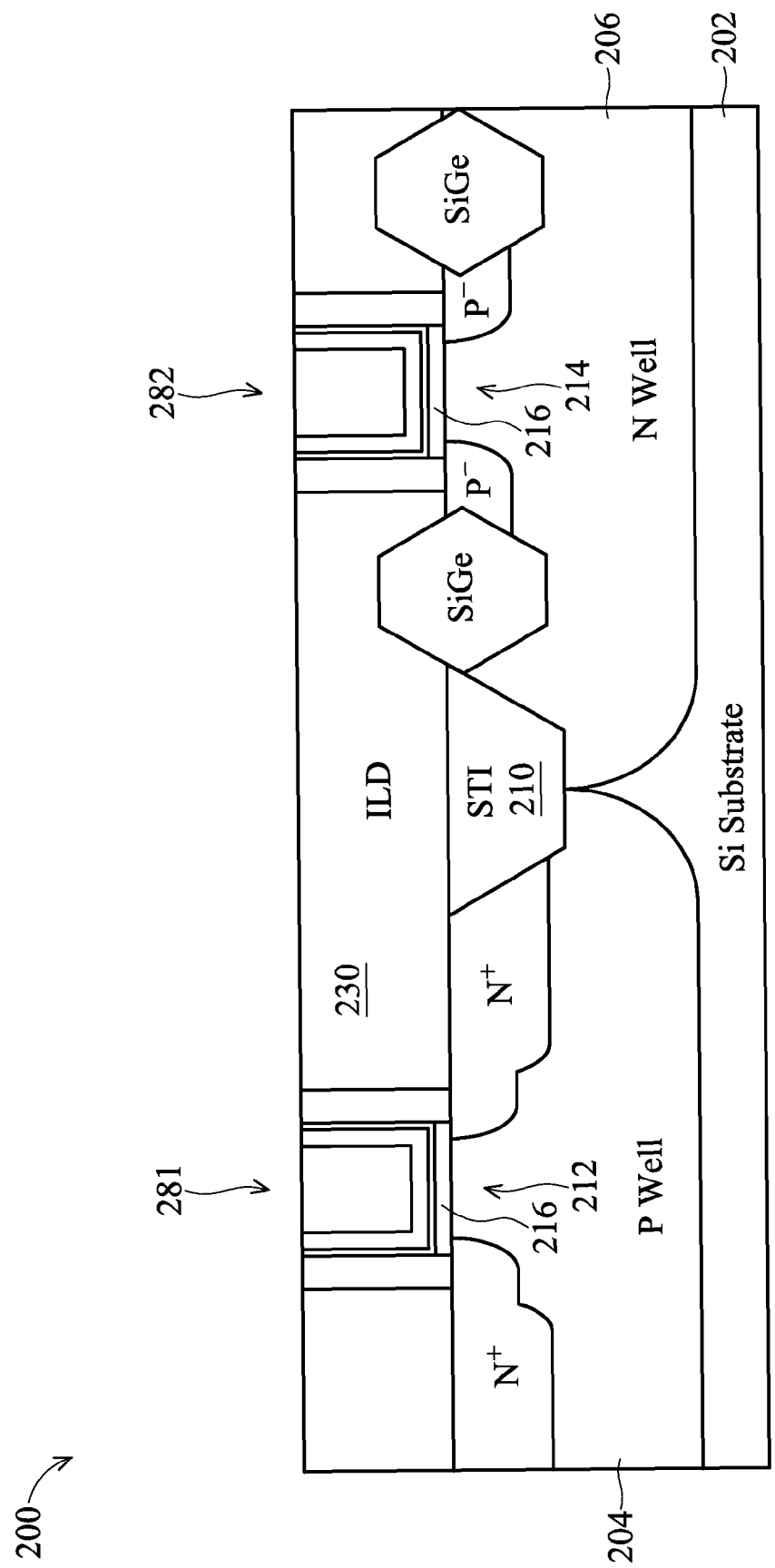

The method 100 continues with block 114 in which a second metal layer may be formed to fill in the remainder of the first trench and in the remainder of the second trench. A fill metal 260 may be deposited to fill in the remainder of the trench 241 and in the remainder of the trench 242. In FIG. 2D, a layer of Ti (not shown) may be deposited to function as a wetting layer for a subsequent Al filling. The Ti layer may be formed by PVD or other suitable process. A layer of Al 260 may be formed on the Ti layer to fill in the remainder of the trench 241 and in the remainder of the trench 242. The Al layer 260 may be formed by forming a first Al layer by CVD and then forming a second Al layer by PVD. It should be noted that the metal filling (e.g., fill margin) of the trench 242 in the pFET 214 side is made easier since a separate N work function metal (N-metal) layer is not deposited in the trench thereby making the opening of the trench smaller. Thus, the risk of forming voids in the metal gates of the nFET 212 and pFET 214 may be minimized for advanced technology nodes (e.g., 45 nm and below).

The method 100 continues with block 116 in which a thermal process may be performed to reflow the second metal layer. The thermal process 270 may be performed to reflow the Al layer 260 with the thinner P-metal layer 256 in the nFET 212 side and with the thicker P-metal layer 246 in the pFET 214 side. The thermal process 270 may be performed at a temperature ranging from 400 to about 500 degree C. Also, the thermal process 270 may be performed for a time period ranging from 120 to about 140 seconds. The reflow of the Al layer 260 causes a reaction of the thinner P-metal layer 256 (TiN) with the Al layer 260 thereby forming TiAlN in the nFET 212 side. That is, the thinner TiN layer 256 allows the Al to inter-diffuse to the TiN layer to form the TiAlN layer for the metal gate in the nFET 212. Accordingly, TiAlN layer is suitable to perform as an N-metal for the nFET 212. It should be noted that the P-metal layer 246 (TiN) in the pFET 214 side is sufficiently thick so as to maintain the effective work function in the pFET 214 as a P-metal. Also, an additional thermal process (similar to the thermal process 270) may be performed immediately after forming the Ti layer (e.g., wetting layer) to open up the trench and reduce overhang for the subsequent Al filling.

The method 100 continues with block 118 in which a CMP process may be performed. In FIG. 2D, the CMP may be performed on the various metal layers to planarize and remove the metal layers outside of the trenches to form gate structures 281, 282 of the nFET 212 and pFET 214, respectively. The CMP process may have a high selectivity to provide a substantially planar surface for the gate structures and ILD layer 230. Accordingly, the metal gate of the nFET 212 may perform the proper N work function and the metal gate of the pFET 214 may perform the proper P work function. Thus, the desired threshold voltages of the nFET 212 and pFET 214, respectively, may be easily achieved to improve device performance and reliability. It is understood that the semiconductor device 200 may undergo further CMOS process flow to form various features such as contacts/vias, interconnect metal layers, interlayer dielectric, passivation layers, etc.

Figure 3A:
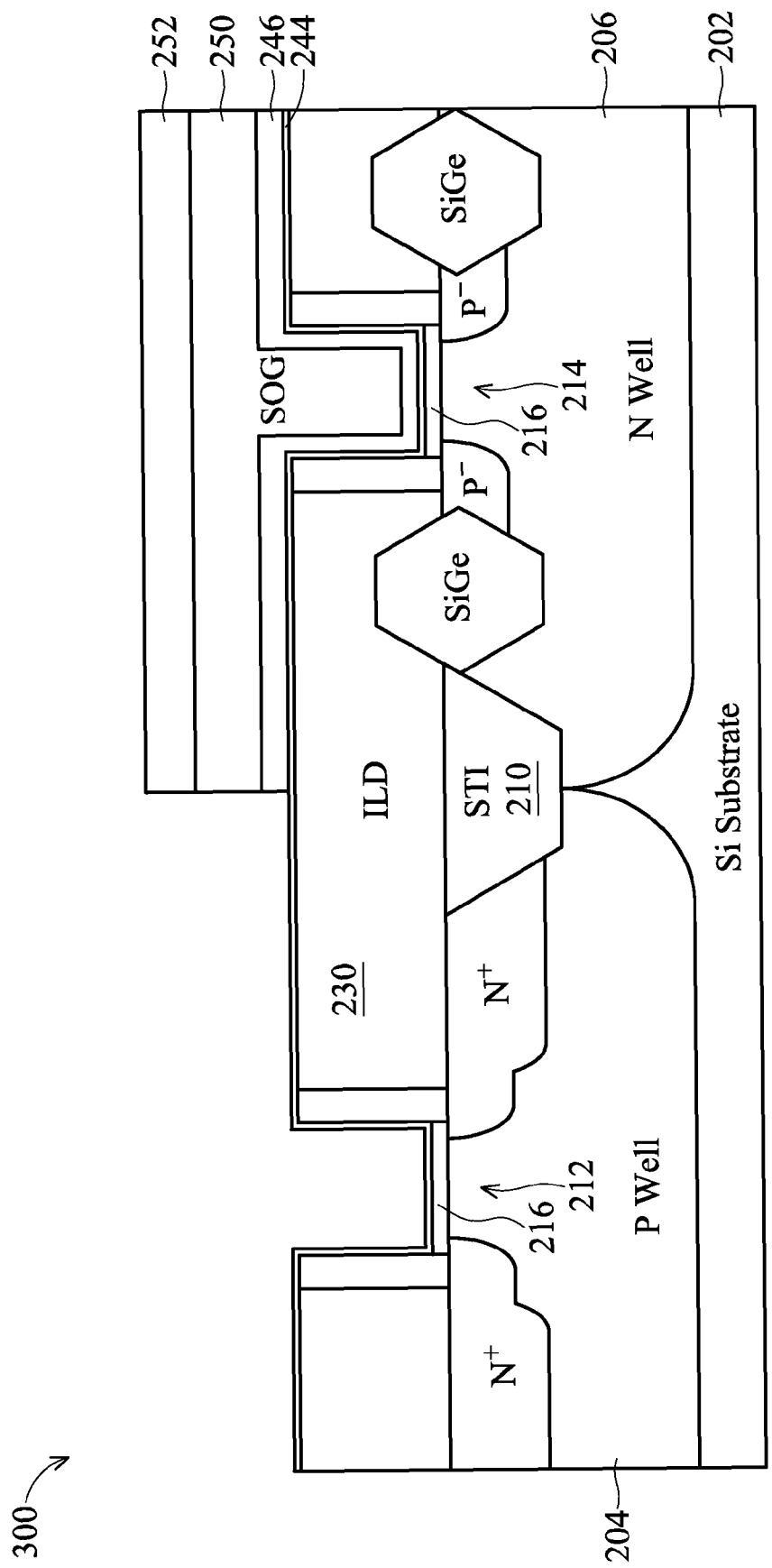
FIGS. 3A to 3D are cross-sectional views of an alternative embodiment of a semiconductor device at various stages of fabrication according to various aspects of the present disclosure.
Figure 3B:
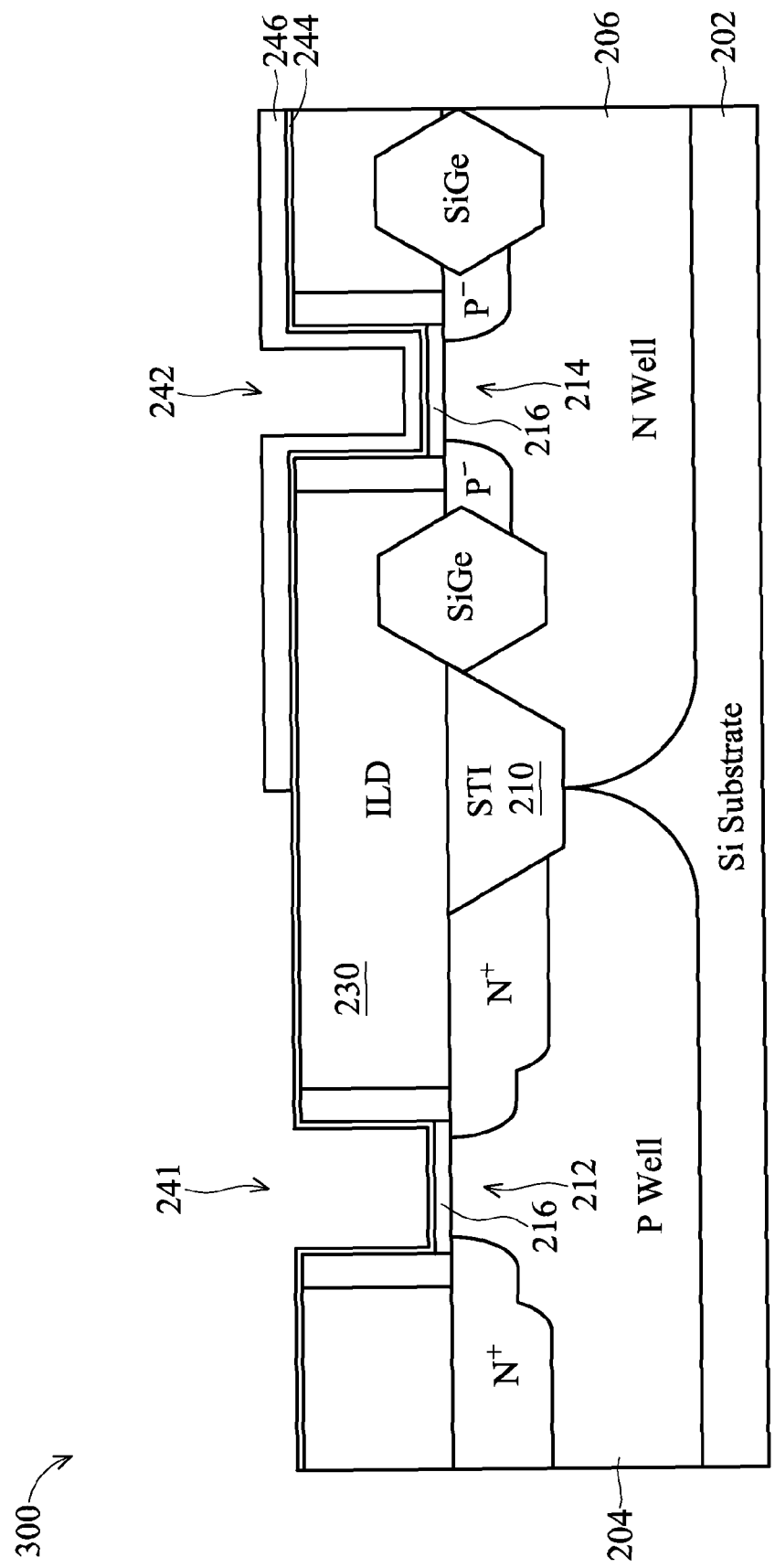

Referring to FIGS. 3A to 3D, illustrated are cross sectional views of alternative embodiment of a semiconductor device 300 having metal gates at various stages of fabrication. The semiconductor device 300 is similar to the semiconductor device 200 of FIG. 2 except for the differences discussed below. Accordingly, similar features in FIGS. 2 and 3 are numbered the same for the sake of simplicity and clarity. The semiconductor device 300 is fabricated by the same method for fabricating the semiconductor device 200 until block 112 of method 100 is reached. In FIG. 3A, the entire P-metal layer (TiN) in the nFET 212 side may be removed rather than leaving a portion of the (thinner) P-metal layer 256 of FIG. 2C in the nFET side. It should be noted that the barrier layer 244 still remains in the trench 241 in the nFET 212 side. In FIG. 3B, the SOG layer 250 and photoresist layer 252 in the pFET 214 side may be removed by a wet etch or dry etch or combination wet and dry etch process.

Figure 3C:
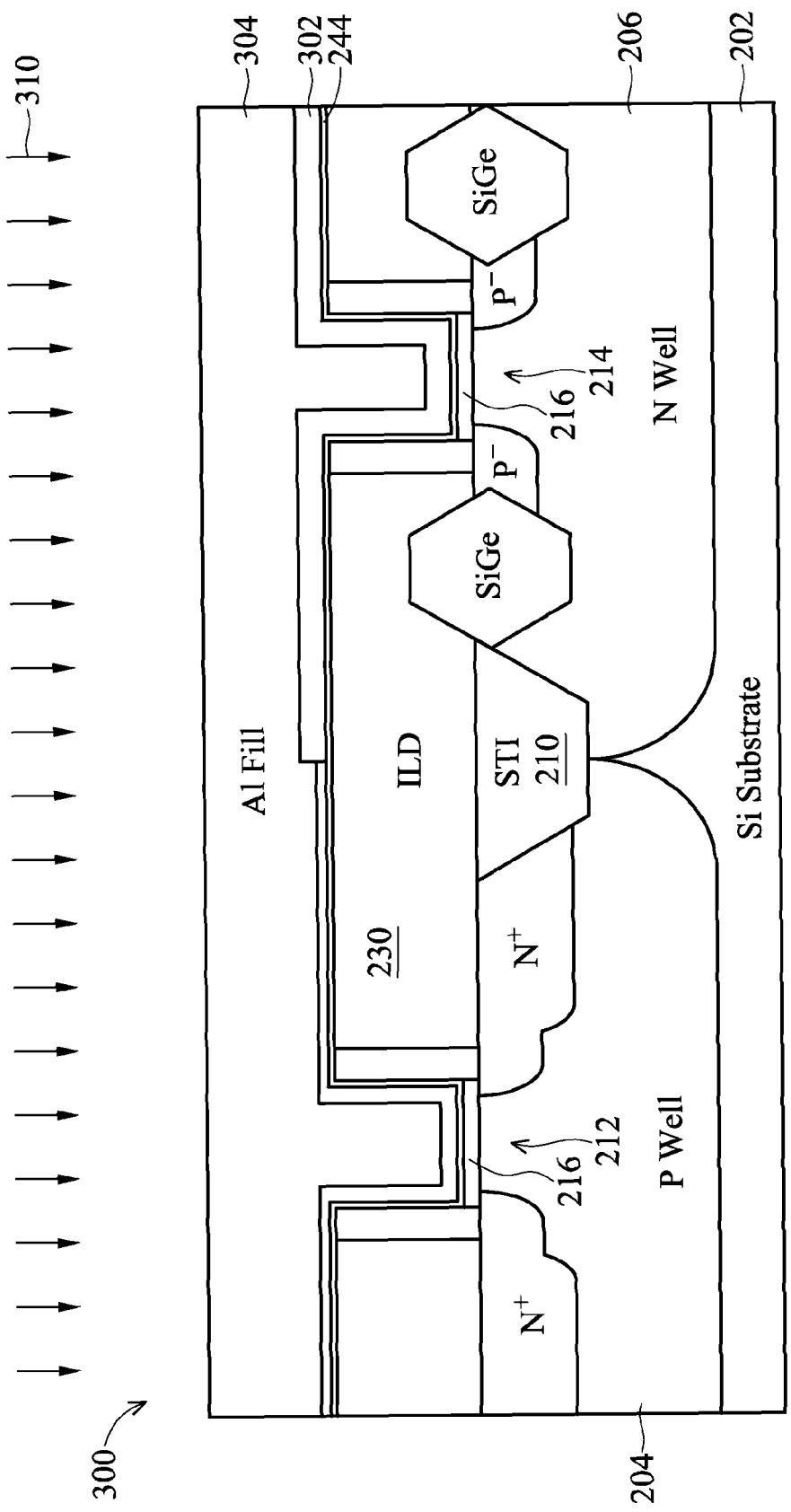

In FIG. 3C, a fill metal may be deposited to fill in the remainder of the trench 241 and in the remainder of the trench 242. A layer of Ti 302 may be deposited to function as a wetting layer for a subsequent Al filling. The Ti layer 302 may also function to react with a subsequent Al layer during reflowing discussed below. The Ti layer 302 may be formed by PVD or other suitable process. A layer of Al 304 may be formed on the Ti layer 302 to fill in the remainder of the trench 241 and in the remainder of the trench 242. The Al layer 304 may be formed by forming a first Al layer by CVD and then forming a second Al layer by PVD. It should be noted that the metal filling (e.g., fill margin) of the trench 242 in the pFET 214 side is made easier since a separate N work function metal (N-metal) layer is not deposited in the trench thereby making the opening of the trench smaller. Thus, the risk of forming voids in the metal gates of the nFET 212 and pFET 214 may be minimized for advanced technology nodes (e.g., 45 nm and below).

A thermal process 310 may be performed to reflow the Al layer 304 with the Ti layer 304 in the nFET 212 side and in the pFET 214 side. The thermal process 310 may be performed at a temperature ranging from 400 to about 500 degree C. Also, the thermal process 310 may be performed for a time period ranging from 120 to about 140 seconds. The reflow of the Al layer 304 causes a reaction of Ti layer 302 with the Al layer thereby forming TiAl in the nFET 212 side. It has been observed that increasing the Al percentage (of $TiAl_x$) adjusts the effective work function towards an N-metal. In some embodiments, the ratio of Ti:Al may include 1:3 to 1:3.4. Accordingly, the $TiAl_x$ layer is suitable to perform as an N-metal for the nFET 212. It should be noted that the P-metal layer 246 (TiN) in the pFET 214 side is sufficiently thick so as to maintain the effective work function in the pFET 214 as a P-metal. Further, the Ti layer 302 in the pFET 214 side blocks the Al in-diffusion to the P-metal layer 246 in the pFET 214 side. Also, an additional thermal process (similar to the thermal process 310) may be performed immediately after forming the Ti layer 302 to open up the trench and reduce overhang for the subsequent Al filling.

Figure 3D:
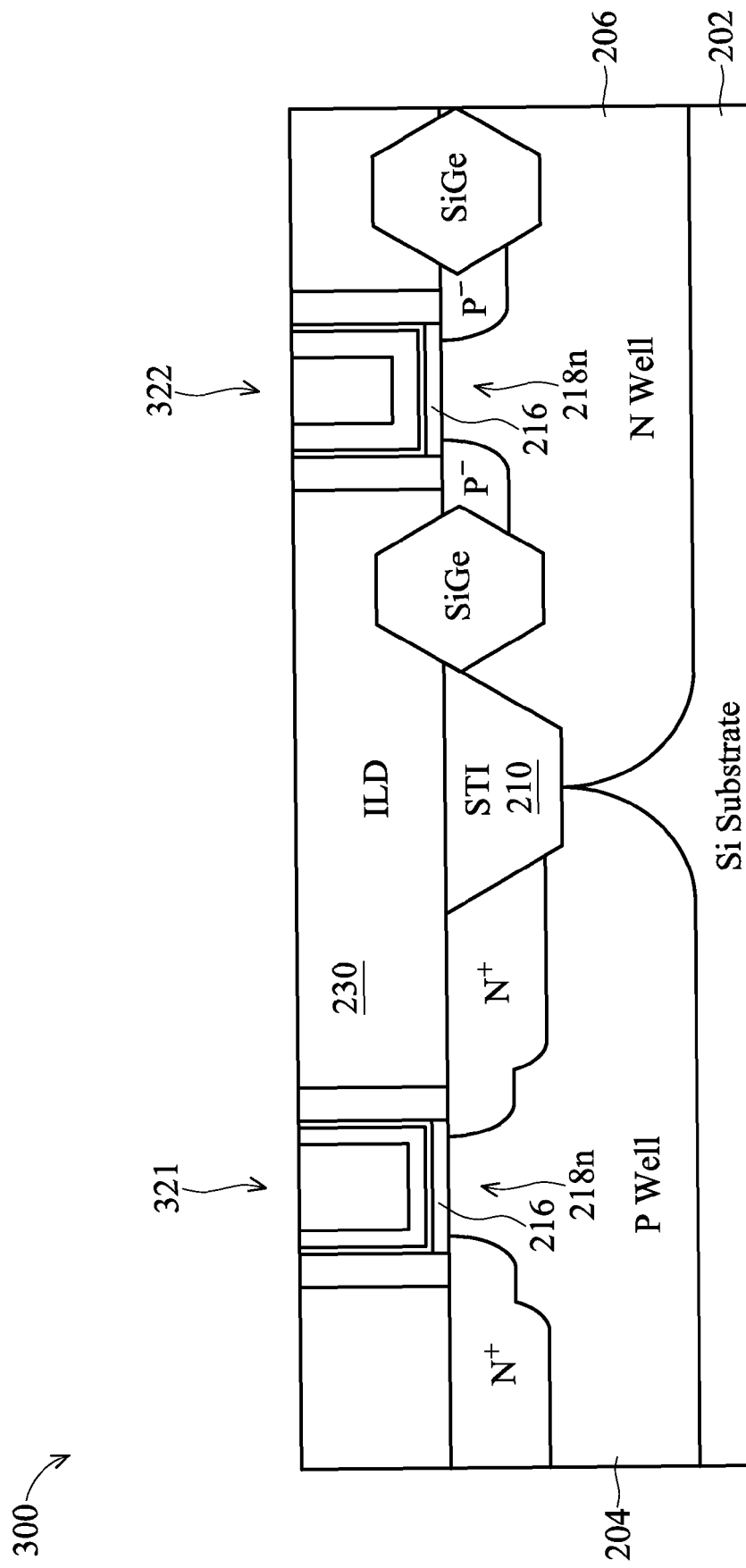

In FIG. 3D, a CMP may be performed on the various metal layers to planarize and remove the metal layers outside of the trenches to form gate structures 321, 322 of the nFET 212 and pFET 214, respectively. The CMP process may have a high selectivity to provide a substantially planar surface for the gate structures and ILD layer 230. Accordingly, the metal gate of the nFET 212 may perform the proper N work function and the metal gate of the pFET 214 may perform the proper P work function. Thus, the desired threshold voltages of the nFET 212 and pFET 214, respectively, may be easily achieved to improve device performance and reliability. It is understood that the semiconductor device 300 may undergo further CMOS process flow to form various features such as contacts/vias, interconnect metal layers, interlayer dielectric, passivation layers, etc.

The present invention achieves different advantages in various embodiments disclosed herein. However, it is understood that different embodiments offer different advantages, and that no particular advantage is necessarily required for all embodiments. For example, the present disclosed method provides a simple and cost-effective method for forming metal gates with proper work functions for NMOS and PMOS devices in a gate last process. The methods and devices disclosed herein do not require forming separate N-metals for the NMOS device and P-metals for the PMOS device, and thus decreasing costs and simplifying processing. Also, a fill margin is increased and the risk of generating voids when performing a metal fill for the metal gates in a gate last process is reduced. Further, the methods and devices disclosed herein may easily be integrated with current CMOS process flow and semiconductor processing equipment. For example, the methods disclosed herein implement materials and processes that are friendly and compatible with the CMOS process flow, and that are inexpensive to incorporate with the process flow.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the specified thickness of the various metal layers may be adjusted to optimize the performance characteristics of the NMOS and PMOS devices for a particular technology node and application. Further, various types of tools may be implemented to deposit the metal layers when forming the metal gates.

What is claimed is:

1. A method of fabricating a semiconductor device comprising:
   providing a semiconductor substrate having a first region and a second region;
   forming a high-k dielectric layer over the semiconductor substrate;
   forming a semiconductor layer over the high-k dielectric layer;
   forming a first gate stack in the first region and a second gate stack in the second region, the first and second gate stacks each including the high-k dielectric layer and the semiconductor layer;
   removing the semiconductor layer from the first gate stack to form a first trench and from the second gate stack to form a second trench;
   forming a barrier layer in the first trench and the second trench;
   forming a first metal layer over the barrier layer, such that the first metal layer includes TiN;
   removing at least a portion of the first metal layer in the first trench;
   forming a second metal layer in the first trench and in the second trench, such that the second metal layer includes a Ti layer and an Al layer on the Ti layer; and
   performing a thermal process at a temperature ranging from about 400 C to about 500 C to reflow the Al layer with the partially removed TiN layer in the first trench to form a TiAlN layer.

2. The method of claim 1, wherein the forming the semiconductor layer includes forming a polysilicon layer over the high-k dielectric layer.

3. The method of claim 1, wherein the performing the thermal process includes performing the thermal process for a time period ranging from 120 to about 140 seconds.

4. The method of claim 1, wherein the removing at least a portion of the first metal layer in the first trench includes removing all of the first metal layer in the first trench.

5. The method of claim 4, wherein the performing the thermal process includes performing the thermal process at a temperature ranging from 400 to about 500 degree C to reflow the Al layer with the Ti layer in the first trench to form a TiAl layer.

6. The method of claim 1, wherein the barrier layer includes TiN or TaN.

7. The method of claim 1, further comprising performing a chemical mechanical polishing (CMP) after performing the thermal process.

8. The method of claim 1, wherein the first gate stack is part of an NMOS device and the second gate stack is part of a PMOS device.

9. A method of fabricating a semiconductor device comprising:
providing a semiconductor substrate having a first region and a second region;
forming a first gate stack in the first region and a second gate stack in the second region, the first gate stack including a first dummy gate and the second gate stack including a second dummy gate;
removing the first dummy gate in the first gate stack thereby forming a first trench and removing the second dummy gate in the second gate stack thereby forming a second trench;
forming a first metal layer including TiN in the first trench and in the second trench;
removing at least 50% of a thickness of the TiN in the first trench;
forming a second metal layer including a Ti layer and an Al layer on the Ti layer in the remainder of the first trench and in the remainder of the second trench;
reflowing the second metal layer with the partially removed TiN layer to form a TiAlN layer; and
performing a chemical mechanical polishing (CMP).

10. The method of claim 9, wherein the removing at least a portion of the first metal layer includes removing all of the TiN layer in the first trench; and
wherein the reflowing the second metal layer includes reflowing the Al layer with the Ti layer in the first trench to form a layer of TiAl in the first trench.

11. The method of claim 9, wherein the forming the Ti layer in the first trench and in the second trench is by physical vapor deposition (PVD);

wherein the forming the Al layer on the Ti layer in the first trench and in the second trench includes:
forming a first portion of the Al layer on the Ti layer by chemical vapor deposition (CVD); and
forming a second portion of the Al layer on the first portion of the Al layer by PVD.

12. The method of claim 9, wherein the forming the first gate stack and the second gate stack includes:
forming an interfacial layer on the substrate;
forming a high-k dielectric layer on the interfacial layer;
forming a barrier layer on the high-k dielectric layer;
forming a polysilicon layer on the barrier layer; and
patterning the interfacial layer, high-k dielectric layer, barrier layer, and polysilicon layer to form the first gate stack in the first region and the second gate stack in the second region;
wherein the patterned polysilicon layer in the first gate stack serves as the first dummy gate and the patterned polysilicon layer in the second gate stack serves the second dummy gate.

13. A method of fabricating a semiconductor device comprising:
providing a semiconductor substrate having a first region and a second region;
forming a first gate stack in the first region, the first gate stack including a first dummy gate;
forming a second gate stack in the second region, the second gate stack including a second dummy gate;
removing the first dummy gate in the first gate stack thereby forming a first trench;
removing the second dummy gate in the second gate stack thereby forming a second trench;
forming a work function TiN metal layer to partially fill the first trench and the second trench;
removing at least 50% of a thickness of the TiN metal layer in the first trench;
forming a Ti metal layer in a remainder of the first trench and in the remainder of the second trench;
forming an Al metal layer on the Ti layer in the remainder of the first trench and in the remainder of the second trench; and
heating the semiconductor device to reflow the Ti metal layer and the Al metal layer thereby forming a TiAlN layer.

14. The method of claim 13, wherein the heating the semiconductor device is at a temperature range from approximately 400 C to approximately 500 C.

15. The method of claim 14, wherein the heating the semiconductor device is performed for a time period ranging from approximately 120 seconds to approximately 140 seconds.

* * * * *